(12) United States Patent
Hyakudomi et al.

(10) Patent No.: US 11,360,115 B2
(45) Date of Patent: Jun. 14, 2022

(54) INSPECTION SYSTEM

(71) Applicant: Tokyo Electron Limited, Tokyo (JP)

(72) Inventors: Takanori Hyakudomi, Nirasaki (JP);
Jun Fujihara, Nirasaki (JP); Hiroaki Sakamoto, Nirasaki (JP); Tomoya Endo, Nirasaki (JP); Xingjun Jiang, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 652 days.

(21) Appl. No.: 16/285,485

(22) Filed: Feb. 26, 2019

(65) Prior Publication Data

US 2019/0265272 A1 Aug. 29, 2019

(30) Foreign Application Priority Data

Feb. 28, 2018 (JP) .............................. JP2018-034379

(51) Int. Cl.
*G01R 1/04* (2006.01)
*G01R 31/317* (2006.01)
*G01R 1/073* (2006.01)

(52) U.S. Cl.
CPC ....... *G01R 1/0408* (2013.01); *G01R 1/07307* (2013.01); *G01R 31/31718* (2013.01)

(58) Field of Classification Search
CPC .............. G01R 1/0408; G01R 1/07307; G01R 31/31718
USPC .................................................... 324/750.19
See application file for complete search history.

(56) References Cited

U.S. PATENT DOCUMENTS

| 6,339,321 | B1* | 1/2002 | Yamashita | ......... G01R 31/2893 |
| | | | | 324/750.14 |
| 9,453,874 | B2* | 9/2016 | Kikuchi | ................... G01R 1/04 |
| 2004/0140794 | A1* | 7/2004 | Back | .................. G01R 31/2886 |
| | | | | 324/750.19 |

FOREIGN PATENT DOCUMENTS

| JP | 2003-297887 A | 10/2003 |
| JP | 2007-073762 A | 3/2007 |
| JP | 2014-150168 A | 8/2014 |
| JP | 2014-179379 A | 9/2014 |
| JP | 2016-181690 A | 10/2016 |

* cited by examiner

*Primary Examiner* — Judy Nguyen
*Assistant Examiner* — Rahul Maini
(74) *Attorney, Agent, or Firm* — Pearne & Gordon LLP (57) ABSTRACT

An inspection system configured to inspect a device within a substrate is provided. The inspection system includes an inspection module, an alignment module, a supporting device and a fixing device. The inspection module has multiple testers and multiple inspection chambers. The multiple testers are allowed to be accommodated in the multiple inspection chambers, respectively. The alignment module has an aligner. The aligner is placed in an alignment space. The aligner is configured to adjust a position of the substrate to be inspected with respect to one tester of the multiple testers, which is accommodated in the alignment space. The supporting device is configured to support the tester accommodated in the alignment space from below. The fixing device is configured to fix the tester accommodated in the alignment space in cooperation with the supporting device.

16 Claims, 10 Drawing Sheets

INSPECTION SYSTEM

CROSS-REFERENCE TO RELATED APPLICATION

This application claims the benefit of Japanese Patent Application No. 2018-034379 filed on Feb. 28, 2018, the entire disclosures of which are incorporated herein by reference.

TECHNICAL FIELD

The various aspects and embodiments described herein pertain generally to an inspection system.

BACKGROUND

In a manufacturing process of an electronic device, electrical characteristics of the electronic device are inspected after it is formed within a substrate. An inspection system is used to inspect the electrical characteristics of the electronic device formed within the substrate. The inspection system is generally equipped with a stage, an aligner and a tester. The tester includes a probe card and a test head. The test head is configured to inspect the electrical characteristics of the electronic device by sending a signal to the electronic device via the probe card. The probe card has a multiple number of contact probes. The contact probes are configured to be come into contact with electrodes of the electronic device. The stage is configured to support the substrate held thereon. The aligner is configured to move the stage to adjust a position of the substrate with respect to the tester and, also, to rotate the stage.

Described in the following Patent Document 1 is an inspection system equipped with multiple testers. In this inspection system, the multiple testers are used to effectively inspect electronic devices respectively formed within multiple substrates. The multiple testers are arranged in a height direction and a direction perpendicular thereto.

Patent Document 1: Japanese Patent Laid-open Publication No. 2014-179379

There is a size limit in a space in which the inspection system is placed. Thus, a footprint of the inspection system needs to be reduced. To reduce the footprint of the inspection system including the multiple testers, it may be considered to perform position adjustment between the testers and the substrates by using a single aligner within a common alignment space without using the same number of aligners as the testers. For the purpose, when accommodated in the alignment space, positions of the testers with respect to the aligner need not be changed.

SUMMARY

In one exemplary embodiment, there is provided an inspection system. The inspection system includes an inspection module, an alignment module, a supporting device and a fixing device. The inspection module has multiple testers and multiple inspection chambers. Each of the multiple testers is equipped with a probe card and a test head. The multiple testers are allowed to be accommodated in the multiple inspection chambers, respectively. The alignment module has an aligner. The aligner is placed in an alignment space. The alignment space is allowed to be connected to the multiple inspection chambers. The aligner is configured to adjust a position of a substrate to be inspected with respect to one tester of the multiple testers, which is accommodated in the alignment space. The supporting device is configured to support the tester accommodated in the alignment space from below. The fixing device is configured to position-align the tester accommodated in the alignment space with respect to the aligner and fix the tester in cooperation with the supporting device.

In the inspection system according to the exemplary embodiment, the tester transferred into the alignment space from the corresponding inspection chamber is supported from below by the supporting device within the alignment space. Then, the position of the tester with respect to the aligner is fixed within the alignment space by the fixing device and the supporting device. Accordingly, in this inspection system, the position of the tester accommodated in the alignment space with respect to the aligner is not changed for each of the testers.

Each of the multiple testers is provided with a first hole and a second hole opened upwards. The fixing device includes a first pin, a second pin and an elevating device. The first pin and the second pin are allowed to be respectively inserted into the first hole and the second hole to position-align the tester accommodated in the alignment space with respect to the aligner. The elevating device is configured to move the first pin and the second pin up and down. According to the exemplary embodiment, the position of the tester accommodated in the alignment space can be fixed with a simple structure.

The first hole and the second hole are spaced apart from each other at a preset distance. A direction in which the first hole and the second hole are arranged is inclined at a preset angle with respect to a transfer direction in which each of the multiple testers is transferred between the alignment space and the corresponding one of the multiple inspection chambers. That is, in this exemplary embodiment, each of the multiple testers is provided with the first hole and the second hole such that the arrangement direction of the first hole and the second hole of the tester is at the same angle with respect to the transfer direction and the first hole and the second hole are spaced apart from each other at the same distance. Therefore, according to the present exemplary embodiment, all the testers can be fixed in the alignment space in the same way by using the first pin and the second pin.

The first hole is a circular hole, and the second hole is an elongated hole. A long axis of the second hole is extended on a straight line connecting a center of the first hole and a center of the second hole.

An opening end portion of each of the first hole and the second hole is formed by a taper surface. The tester accommodated in the alignment space is position-aligned with respect to the aligner as the first pin comes into contact with the taper surface forming the first hole and the second pin comes into contact with the taper surface forming the second hole. In the exemplary embodiment, the tester is sandwiched between the fixing device (the first pin and the second pin) and the supporting device so that the position of the tester is fixed.

The supporting device is configured to support the tester such that the tester accommodated in the alignment space is allowed to be slid on the supporting device. According to the exemplary embodiment, the movement of the tester to a fixing position within the alignment space is enabled. The supporting device includes multiple cam followers or multiple ball transfer units.

The inspection system further includes a sensor. The sensor is configured to detect whether the tester accommodated in the alignment space is supported horizontally by the supporting device. In this exemplary embodiment, the position of the tester can be fixed after achieving a state in which the tester is horizontally placed on the supporting device based on a detection signal from the sensor.

The inspection system further includes a transfer device. The transfer device is configured to transfer each of the multiple testers into the alignment space from the corresponding one of the multiple inspection chambers and place the transferred tester on the aligner within the alignment space.

The multiple inspection chambers are provided at both sides of the alignment space. The transfer device includes a first clamp and a second clamp. The first clamp is configured to grip one of the multiple testers, which is arranged at one side of the alignment space. The second clamp is configured to grip one of the multiple testers, which is arranged at the other side of the alignment space. The transfer device further includes a first moving device and a second moving device. The first moving device is configured to move the first clamp from the alignment space in a direction toward the one side of the alignment space and in an opposite direction thereto. The second moving device is configured to move the second clamp from the alignment space in a direction toward the other side of the alignment space and in an opposite direction thereto. In another exemplary embodiment, the transfer device further includes a moving device. The moving device is configured to move both the first clamp and the second clamp in a direction from the one side of the alignment space toward the other side thereof and in an opposite direction thereto.

As stated above, it is possible to fix the position of the tester accommodated in the alignment space with respect to the aligner.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described with reference to the accompanying drawings. In the various drawings, same or corresponding parts will be assigned same reference numerals.

Figure 1:
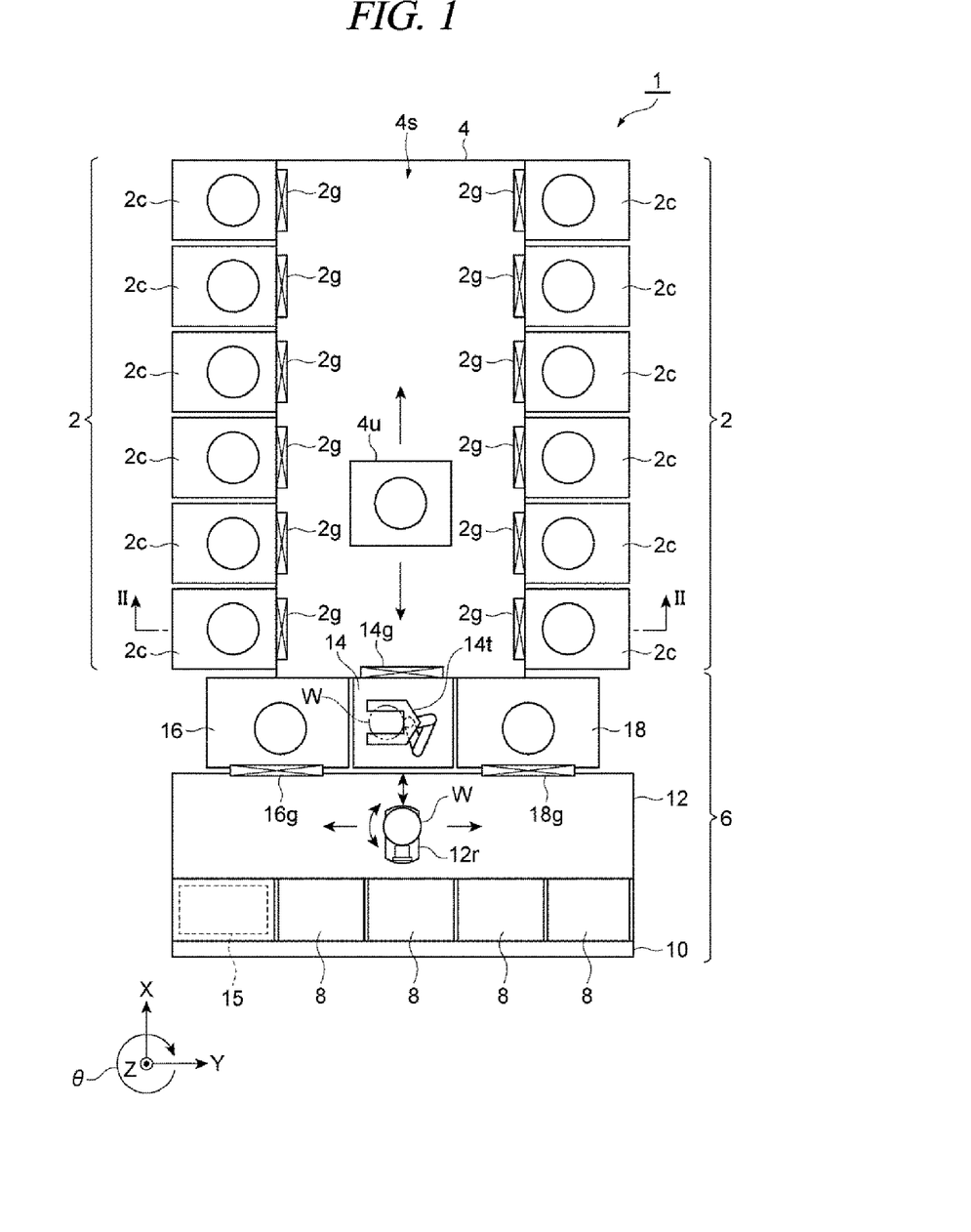
FIG. 1 is a diagram schematically illustrating an inspection system according to an exemplary embodiment.
Figure 2:
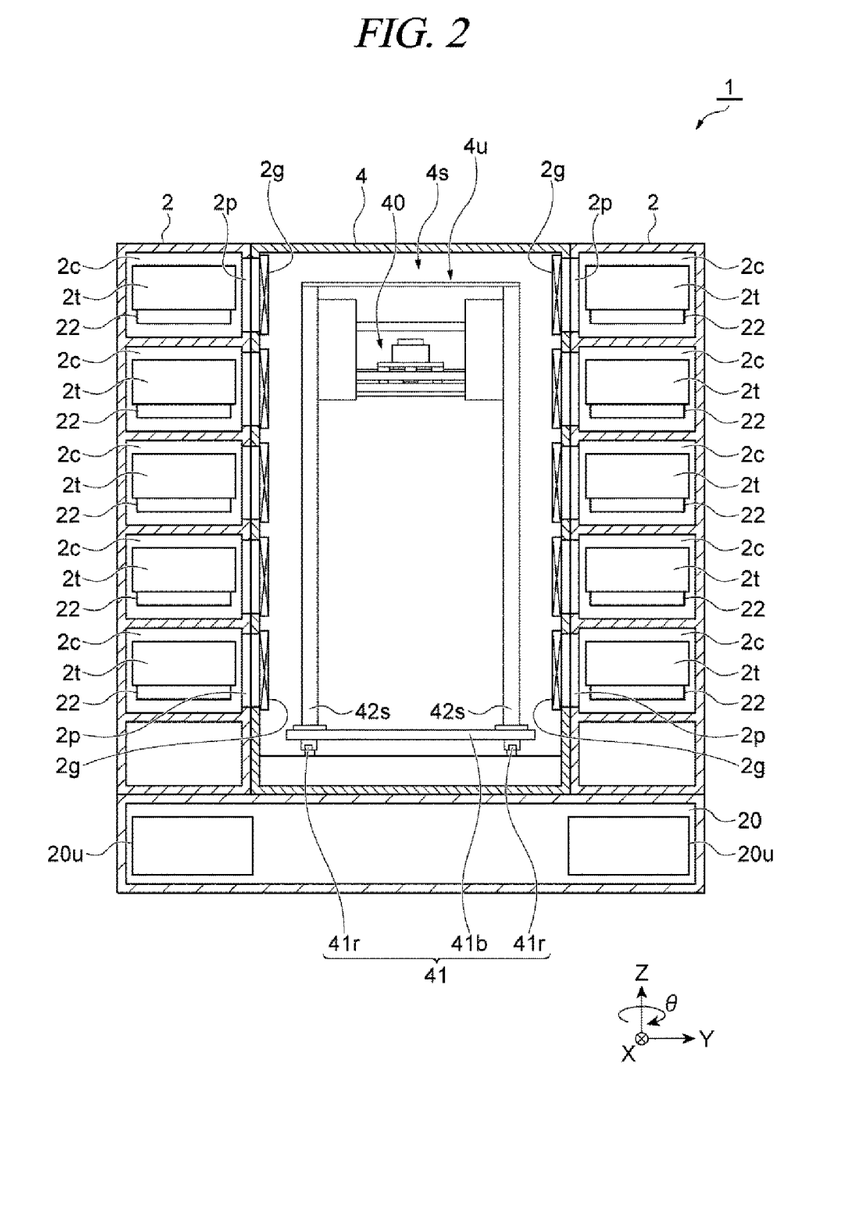
FIG. 2 is a cross sectional view taken along a line II-II of FIG. 1.

FIG. 1 is a diagram schematically illustrating an inspection system according to an exemplary embodiment. FIG. 2 is a cross sectional view taken along a line II-II of FIG. 1. An inspection system 1 shown in FIG. 1 and FIG. 2 is configured to inspect an electrical characteristic of an electronic device formed within a substrate. The inspection system 1 is equipped with an inspection module 2 and an alignment module 4.

The inspection module 2 is provided with multiple inspection chambers 2c. The inspection module 2 includes multiple testers 2t. Each of the multiple testers 2t is capable of being accommodated in a corresponding one of the multiple inspection chambers 2c. Each tester 2t is configured to inspect an electrical characteristic of a substrate W within the corresponding inspection chamber 2c.

The alignment module 4 is provided with an alignment space 4s. The alignment module 4 has an alignment unit 4u. The alignment unit 4u is arranged within the alignment space 4s.

In the shown example, the multiple inspection chambers 2c are arranged at both sides of the alignment space 4s. Some of the multiple inspection chambers 2c (for example, half of them) are arranged at one side of the alignment space 4s along a height direction (that is, the Z direction) and along one direction (X direction) perpendicular to the Z direction. The X direction is parallel to a lengthwise direction of the alignment space 4s. The rest of the multiple inspection chambers 2c are arranged at the other side of the alignment space 4s along the X direction and the Z direction. Further, the number and the arrangement of the multiple inspection chambers 2c are not particularly limited.

According to the exemplary embodiment, the inspection system 1 is further equipped with a loader unit 6. The loader unit 6 includes a plurality of vessels 8, a placing table 10, a loader module 12, a transfer module 14, a buffer module 16 and a pre-alignment module 18.

Each of the plurality of vessels 8 is configured to accommodate a multiple number of substrates W therein. Each vessel 8 is, by way of example, but not limitation, a FOUP (Front Opening Unified Pod). These vessels 8 are mounted on the placing table 10. The placing table 10 has a load port.

The loader module 12 is equipped with a loader 12r. The loader 12r is configured to be movable in the X direction, the Y direction and the Z direction and rotatable around the Z-axis (θ direction) within the loader module 12. Further, the Y direction is a direction perpendicular to the X direction and the Z direction. The loader 12r receives a substrate W accommodated in any one of the plurality of vessels 8 via the load port. The loader 12r transfers the received substrate W into the buffer module 16 or the pre-alignment module 18. Further, the loader 12r transfers the substrate W after being subjected to the inspection within the buffer module 16 back into any one of the plurality of vessels 8.

The buffer module 16 has a space therein. The substrate W is temporarily placed in the space within the buffer module 16. The pre-alignment module 18 is configured to perform pre-alignment of the substrate W by accommodating the substrate W in a space therein. The space within the buffer module 16 is allowed to be connected to a space within the loader module 12 through an opening of the buffer module 16. The opening of the buffer module 16 can be opened or closed by a shutter 16g. The space within the pre-alignment module 18 is allowed to be connected to the space within the loader module 12 through an opening of the pre-alignment module 18. The opening of the pre-alignment module 18 can be opened or closed by a shutter 18g.

The shutter 16g and the shutter 18g are configured to separate an atmospheric atmosphere and a dry atmosphere. In the inspection system 1, the alignment space 4s, the multiple inspection chambers 2c, a space within the transfer module 14, the space within the buffer module 16 and the space within the pre-alignment module 18 are regulated to be in the dry atmosphere. The dry atmosphere is created by supplying dry air into these spaces. Meanwhile, spaces of the other components of the loader unit 6 are adjusted to be in the atmospheric atmosphere.

The transfer module 14 is equipped with a transfer device 14t. The transfer device 14t is, for example, a multi-joint robot. The transfer device 14t is configured to be movable up and down in the space within the transfer module 14. An opening connected to the alignment space 4s is formed at a lower portion of the transfer module 14. The transfer device 14t transfers the substrate W between the alignment space 4s and the space within the transfer module 14 through this opening. Further, above the opening of the transfer module 14, the transfer device 14t delivers the substrate W to/from each of the buffer module 16 and the pre-alignment module 18.

The opening of the transfer module 14 can be opened or closed by the shutter 14g. The shutter 14g securely suppresses introduction of the atmospheric atmosphere into the alignment space 4s and the multiple inspection chambers 2c. Further, the multiple inspection chambers 2c are partitioned from each other by walls. Respectively formed at the walls forming the inspection chambers 2c are openings 2p which are connected to the alignment space 4s. The openings 2p can be opened or closed by corresponding shutters 2g. By using the shutters 2g, the atmosphere of the multiple inspection chambers 2c can be individually adjusted.

A chiller area 20 is provided under the transfer module 14, the inspection module 2 and the alignment module 4. A chiller unit 20u is provided within the chiller area 20. The chiller unit 20u is provided under the bottommost inspection chamber 2c in the Z direction.

As stated above, the tester 2t is accommodated in each of the multiple number of inspection chambers 2c. A chuck top 22 is also accommodated in each of the multiple inspection chambers 2c. The chuck top 22 is configured to mount the substrate W thereon. In each of the multiple number of inspection chambers 2c, the electrical characteristic of the electronic device formed on the substrate W is inspected in the state that the chuck top 22 mounting the substrate W thereon is attracted to a contact unit (for example, an interface board) of the tester 2t.

Figure 3:
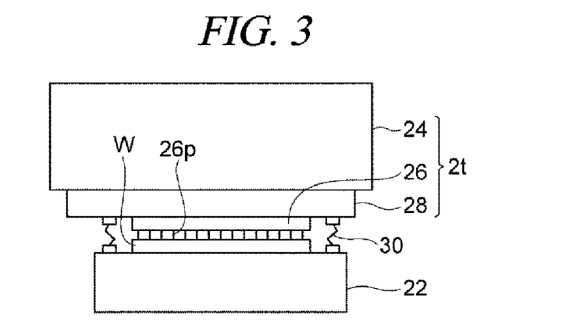
FIG. 3 is a diagram illustrating a tester and a chuck top according to the exemplary embodiment.

FIG. 3 is a diagram showing the tester and the chuck top according to the exemplary embodiment. FIG. 3 illustrates the tester 2t and the chuck top 22 when the inspection of the electrical characteristic of the substrate W is being performed. As depicted in FIG. 3, the tester 2t is equipped with a test head 24 and a probe card 26. The tester 2t may be further equipped with an interface board 28 and a bellows 30.

The test head 24 is configured to inspect the electrical characteristic of the electronic device by outputting signals to the electronic device via the probe card 26. The test head 24 has one or more tester module boards within a housing. The tester module board is configured to perform a supply of a power to the electronic device formed within the substrate W, an input of a waveform (driver), a measurement of the waveform (comparator), an output of a voltage and a current and a measurement of the voltage and the current.

The probe card 26 has a multiple number of contact probes 26p. Each of these contact probes 26p has a needle shape or a rod shape. These contact probes 26p are brought into contact with electrodes of the electronic device when the inspection of the electrical characteristic of the electronic device is being performed. The interface board 28 is provided between the test head 24 and the probe card 26. The interface board 28 has a multiple number of pogo pins. These pogo pins are configured to connect the multiple number of contact probes 26p to the test module boards of the test head 24. The bellows 30 is configured to form a sealed space between the chuck top 22 and the tester 2t (for example, the interface board 28) when the chuck top 22 mounting the substrate W thereon is attracted to the tester 2t.

The chuck top 22 is configured to attract the substrate W placed thereon. Further, the chuck top 22 is equipped with a temperature control mechanism. The temperature control mechanism of the chuck top 22 may use a coolant from the chiller unit 20u. Alternatively, the temperature control mechanism of the chuck top 22 may have a heater therein.

The chuck top 22 is attracted to the tester 2t as the aforementioned space formed by the bellows 30 is decompressed. In the state that the chuck top 22 is attracted to the tester 2t, the contact probes 26p come into contact with the electrodes of the electronic device within the substrate W. The electrical signals are applied to the electronic device from the test head 24 via the contact probes 26p, and response signals are sent to the test head 24 from the electronic device. By using this response signals, the electrical characteristic of the electronic device is inspected.

Alignment between each of the multiple number of testers 2t and the substrate W is performed in the alignment space 4s by using the alignment unit 4u. For the purpose, each tester 2t is brought into the alignment space 4s through the opening 2p from the corresponding one of the multiple inspection chambers 2c.

Figure 4:
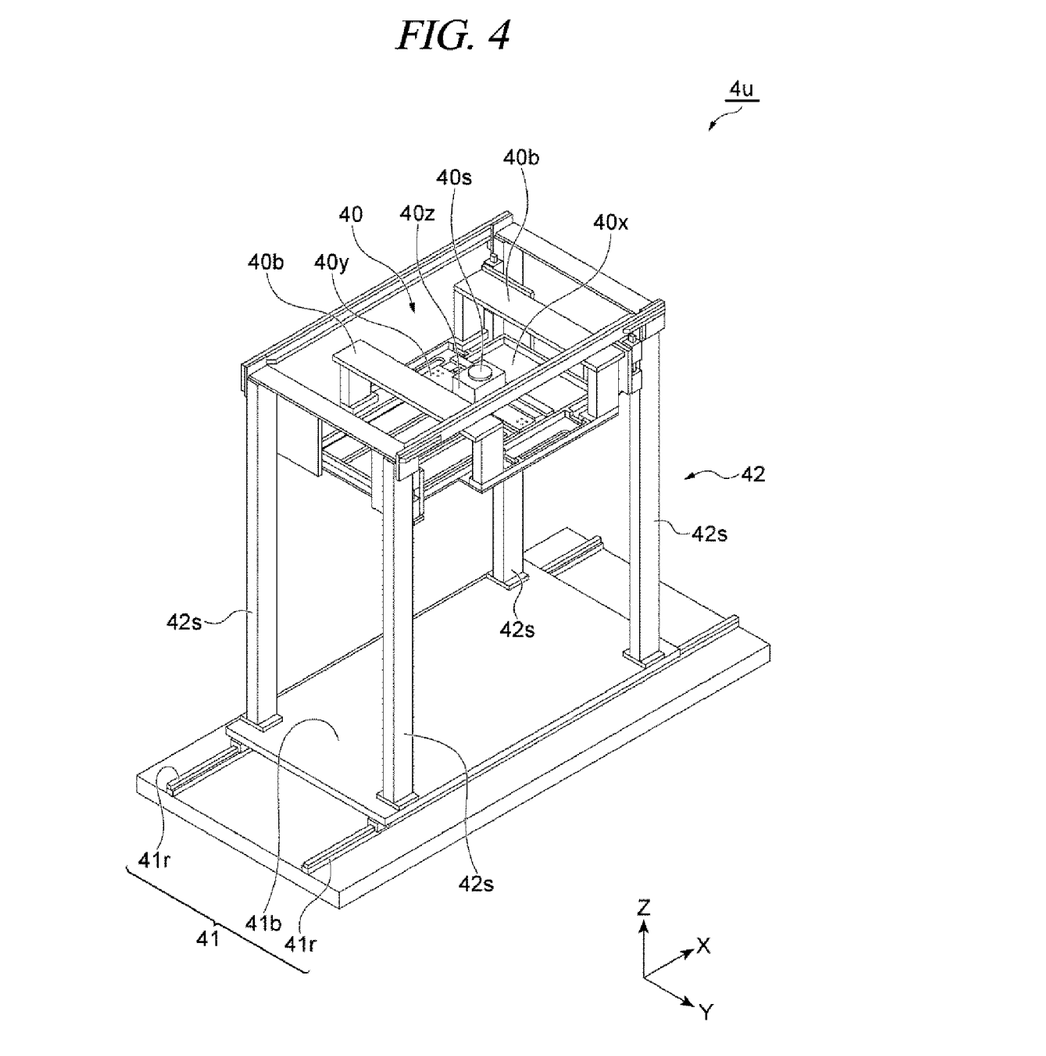
FIG. 4 is a perspective view illustrating an alignment unit of an alignment module shown in FIG. 1.

Below, referring to FIG. 2 and FIG. 4, the alignment module 4 will be explained. FIG. 4 is a perspective view illustrating the alignment unit of the alignment module shown in FIG. 1. The alignment unit 4*u* of the alignment module 4 includes an aligner 40, a moving device 41 and a moving device 42.

The moving device 41 is configured to move the aligner 40 and the moving device 42 in the X direction. The moving device 41 is equipped with a base block 41*b* and multiple rails 41*r*. The multiple rails 41*r* are arranged to be parallel to each other and extended in the X direction. The base block 41*b* has a substantially plate shape, and extended in the X direction and the Y direction. The base block 41*b* is mounted on the rails 41*r*. The base block 41*b* is configured to be movable in the X direction along the rails 41*r*. A power for the movement of the base block 41*b* in the X direction is applied from a driving unit of the moving device 41. The driving unit of the moving device 41 may be, by way of example, a linear motor.

The base block 41*b* supports the moving device 42, and the moving device 42 supports the aligner 40 such that the aligner 40 is movable in the Z direction. The moving device 42 is equipped with a plurality of supporting columns 42*s*. In the shown example, the moving device 42 has four supporting columns 42*s*. These supporting columns 42*s* are extended from the base block 41*b* in the Z direction (upwards).

The moving device 42 may further include a guide and a driving unit. Above the base block 41*b*, the guide of the moving device 42 is extended in the Z direction (upwards). The driving unit of the moving device 42 is configured to generate a power for moving the aligner 40 up and down along the guide of the moving device 42. The driving unit of the moving device 42 may be, by way of non-limiting example, a motor.

The aligner 40 is configured to perform the alignment between the substrate W and the tester 2*t* within the alignment space 4*s*. The aligner 40 is equipped with a stage 40*x*, a stage 40*y*, a stage 40*z* and an attracting unit 40*s*. The attracting unit 40*s* is configured to hold the chuck top 22 by attracting the chuck top 22 placed on a top surface thereof. The attracting unit 40*s* is mounted on the stage 40*z*. The stage 40*z* is configured to move the attracting unit 40*s* in the Z direction. That is, the stage 40*z* is configured to move the attracting unit 40*s* up and down. Further, the attracting unit 40*s* is also configured to be rotatable in the θ direction. The stage 40*z* is mounted on the stage 40*y*. The stage 40*y* is configured to move the stage 40*z* and the attracting unit 40*s* in the Y direction. The stage 40*y* is mounted on the stage 40*x*. The stage 40*x* is configured to move the stage 40*y*, the stage 40*z* and the attracting unit 40*s* in the X direction. A position of the chuck top 22 on the attracting unit 40*s* is adjusted by using an image acquired by an upper camera 40*u* (see FIG. 6). Further, a position of the substrate W on the chuck top 22 with respect to the probe card 26 is adjusted by using an image acquired by a lower camera 40*d* (see FIG. 6).

Figure 5:
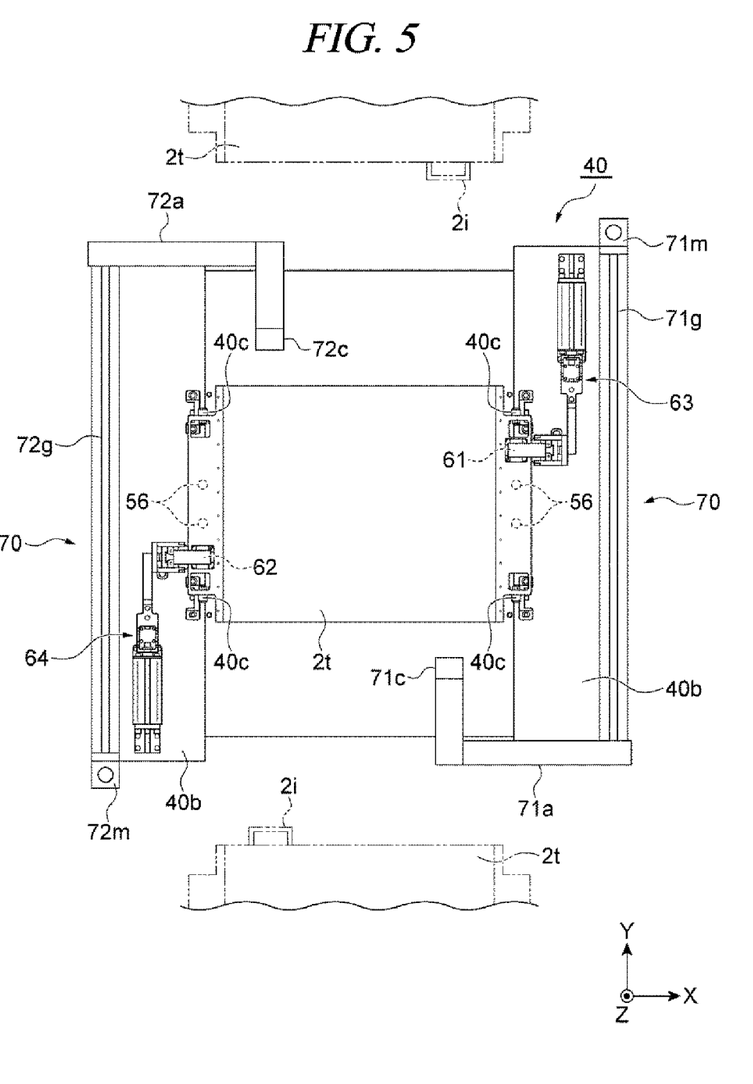
FIG. 5 is a top view of an aligner of the inspection system shown in FIG. 1.
Figure 6:
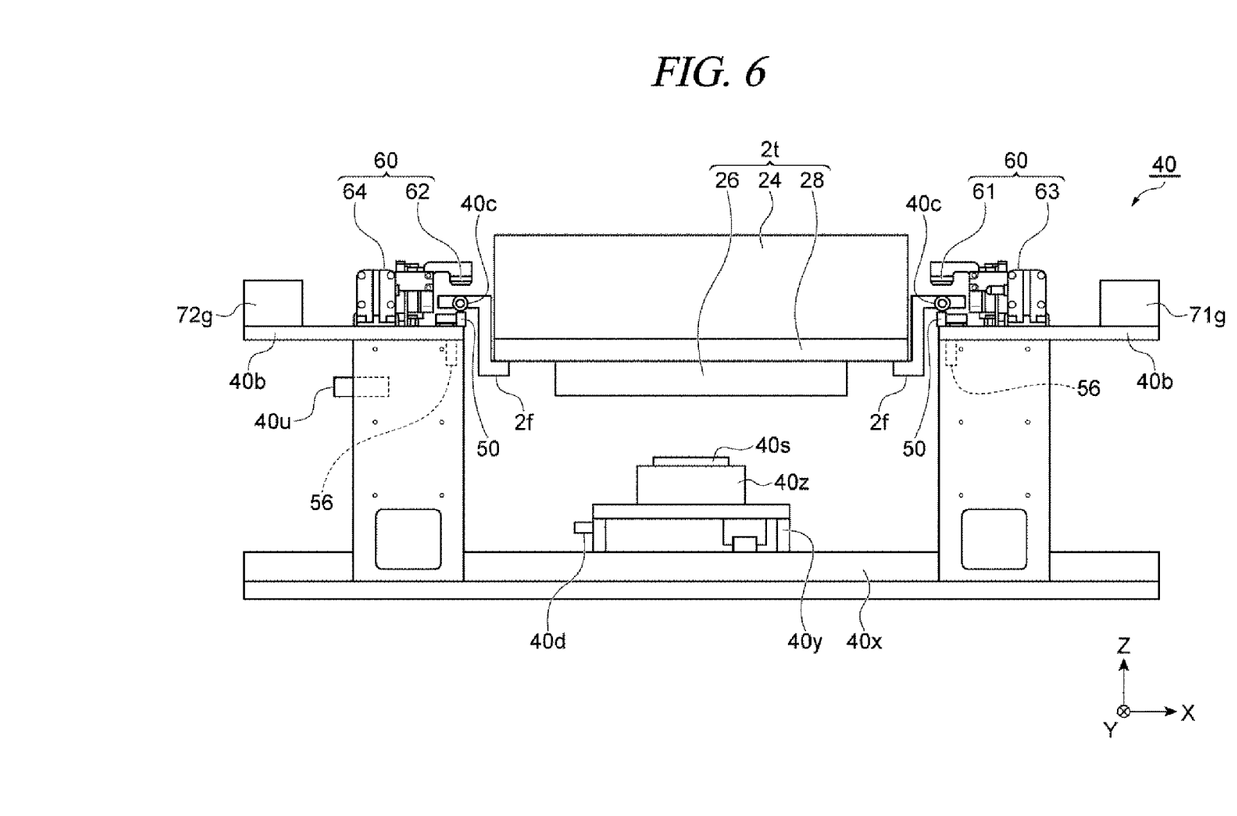
FIG. 6 is a side view of the aligner of the inspection system shown in FIG. 1.

The inspection system 1 is further equipped with a supporting device 50 and a fixing device 60 to fix a position of the tester 2*t* with respect to the aligner 40. In the present exemplary embodiment, the supporting device 50 and the fixing device 60 are provided in the aligner 40. Below, referring to FIG. 5 and FIG. 6, the supporting device 50 and the fixing device 60 will be described. FIG. 5 is a top view of the aligner of the inspection system shown in FIG. 1. FIG. 6 is a side view of the aligner of the inspection system shown in FIG. 1.

As depicted in FIG. 5 and FIG. 6, the inspection system 1 further includes a transfer device 70. The transfer device 70 is provided in the aligner 40. The transfer device 70 is configured to transfer each of the multiple testers 2*t* into the alignment space 4*s* from the corresponding one of the multiple inspection chambers 2*c* and place the transferred tester 2*t* on the aligner 40 within the alignment space 4*s*.

The aligner 40 has a pair of bridges 40*b*. The bridges 40*b* have a substantially plate shape and are extended, in the Y direction, above and at both sides of the attracting unit 40*s*. The transfer device 70 includes a first guide 71*g*, a second guide 72*g*, a first arm 71*a*, a second arm 72*a*, a first clamp 71*c*, a second clamp 72*c*, a first driving unit 71*m* and a second driving unit 72*m*. The first guide 71*g*, the first arm 71*a* and the first driving unit 71*m* constitute a first driving device configured to move the first clamp 71*c* in the Y direction and in the opposite direction thereto. The second guide 72*g*, the second arm 72*a* and the second driving unit 72*m* constitute a second moving device configured to move the second clamp 72*c* in the Y direction and in the opposite direction thereto.

The first guide 71*g* is extended in the Y direction on one of the pair of bridges 40*b*. The first guide 71*g* includes, for example, a screw shaft, and this screw shaft is extended in the Y direction. The first arm 71*a* is configured to be movable in the Y direction and the opposite direction along the first guide 71*g*. The first driving unit 71*m* is configured to rotate the screw shaft of the first guide 71*g*. The first driving unit 71*m* may be, but not limited to, a motor. If the screw shaft of the first guide 71*g* is rotated, the first arm 71*a* is moved in the Y direction and the opposite direction. The first clamp 71*c* is provided at a leading end of the first arm 71*a*. The first clamp 71*c* is configured to hold a grip 2*i* of the tester 2*t* placed at one side of the alignment space 4*s* in the Y direction. The first clamp 71*c* may be, by way of example, an air-driving type clamp.

The second guide 72*g* is extended in the Y direction on the other of the pair of bridges 40*b*. The second guide 72*g* includes, for example, a screw shaft, which is extended in the Y direction. The second arm 72*a* is configured to be movable in the Y direction and the opposite direction along the second guide 72*g*. The second driving unit 72*m* is configured to rotate the screw shaft of the second guide 72*g*. The second driving unit 72*m* may be, but not limited to, a motor. If the screw shaft of the second guide 72*g* is rotated, the second arm 72*a* is moved in the Y direction and the opposite direction. The second clamp 72*c* is provided at a leading end of the second arm 72*a*. The second clamp 72*c* is configured to hold a grip 2*i* of the tester 2*t* placed at the other side of the alignment space 4*s* in the Y direction. The second clamp 72*c* may be, by way of example, an air-driving type clamp.

The supporting device 50 is configured to support the tester 2*t* accommodated in the alignment space 4*s* from below. The tester 2*t* can be transferred into the alignment space 4*s* by the transfer device 70 as stated above. Further, the transfer device 70 is configured to adjust the position of the tester 2*t* within the alignment space 4*s* based on the position of the tester 2*t* in the Y direction detected by a sensor.

In the exemplary embodiment, the supporting device 50 is configured to support the tester 2*t* such that the tester 2*t* accommodated in the alignment space 4*s* is slidable on the supporting device 50. As an example, the supporting device 50 includes a plurality of cam followers. The number of the cam followers of the supporting device 50 may be, for example, four. Each of these cam followers is configured to be rotatable around an axis extended in the X direction. Some of these cam followers are arranged at one of the pair of bridges 40b in the Y direction while the others are arranged on the other of the pair of bridges 40b in the Y direction.

The tester 2t has a frame 2f. The frame 2f supports the test head 24, the interface board 28 and the probe card 26. The frame 2f is provided with a recess portion which is opened at a bottom portion thereof. The test head 24 and the interface board 28 are placed within the recess portion of the frame 2f. The probe card 26 is placed under the frame 2f. The frame 2f has a pair of upper end portions. These upper end portions of the frame 2f are extended in both opposite X directions with respect to the test head 24. A plurality of cam followers 40c is provided at the pair of upper end portions of the frame 2f. Each of these cam followers 40c is configured to be rotatable around an axis extended in the Y direction. Each cam follower 40c is placed on a corresponding one of the plurality of cam followers of the supporting device 50.

If the cam followers 40c come into contact with the cam followers of the supporting device 50, the tester 2t is horizontally supported from below within the alignment space 4s. It can be detected from detection signals from a plurality of sensors 56 whether the tester 2t is horizontally supported by the supporting device 50. Some (e.g., two) of the plurality (e.g., four) of sensors 56 are supported by one of the pair of bridges 40b and arranged in the Y direction. The others (e.g., two) of the plurality of sensors 56 are supported by the other of the pair of bridges 40b and arranged in the Y direction. Each of the sensors 56 is configured to output the detection signal indicating a height position of the pair of upper end portions of the frame 2f. If it is determined based on the detection signals from the sensors 56 that the height positions of the pair of upper end portions of the frame 2f are substantially same, it is decided that the tester 2t is horizontally supported by the supporting device 50 from below.

Figure 7A:
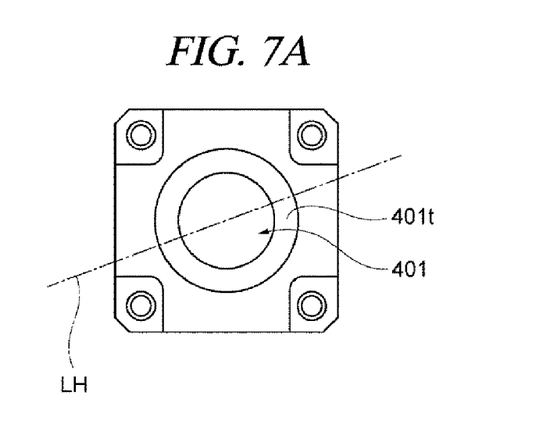
FIG. 7A is a top view illustrating a first hole of the tester and FIG. 7B is a top view illustrating a second hole of the tester.
Figure 7B:
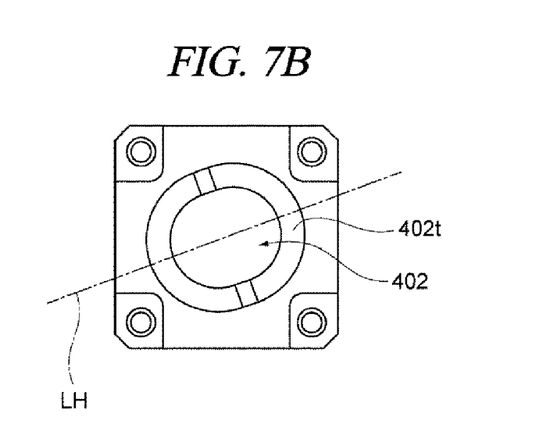
Figure 8A:
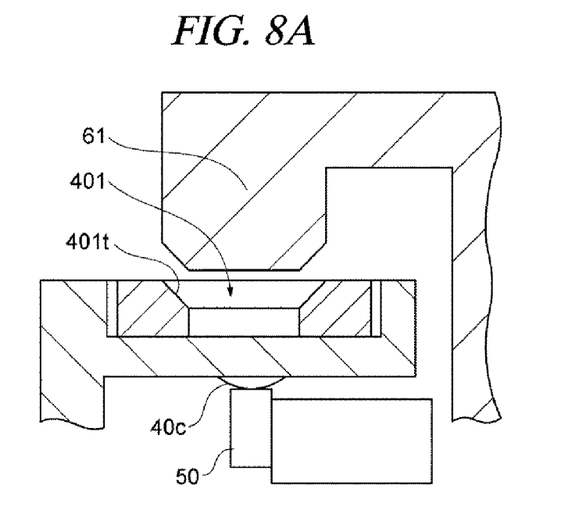
FIG. 8A is a cross sectional view illustrating the first hole of the tester and a first pin and FIG. 8B is a cross sectional view illustrating the second hole of the tester and a second pin.
Figure 8B:
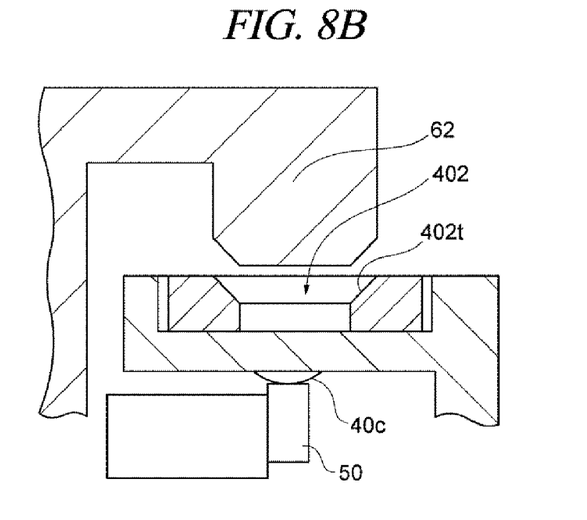

The fixing device 60 is configured to fix the tester 2t in cooperation with the supporting device 50 by aligning the position of the tester 2t accommodated in the alignment space 4s with respect to the aligner 40. In the exemplary embodiment, each tester 2t has a first hole 401 and a second hole 402. Further, the fixing device 60 has a first pin 61, a second pin 62, a first elevating device 63 and a second elevating device 64. Hereinafter, reference is made to FIG. 7A, FIG. 7B, FIG. 8A and FIG. 8B as well as FIG. 5 and FIG. 6. FIG. 7A is a top view illustrating the first hole of the tester, and FIG. 7B is a top view illustrating the second hole of the tester. FIG. 8A is a cross section view illustrating the first hole of the tester and the first pin, and FIG. 8B is a cross sectional view illustrating the second hole of the tester and the second pin.

The first hole 401 is formed at one of the pair of upper end portions of the frame 2f. The second hole 402 is formed at the other of the pair of upper end portions of the frame 2f. The first hole 401 and the second hole 402 are opened upwards.

The first pin 61 is capable of being inserted into the first hole 401. The first elevating device 63 is configured to move the first pin 61 up and down. The first elevating device 63 is equipped with, by way of example, an air cylinder and a converting mechanism. The air cylinder moves a load along the Y direction. The converting mechanism is configured to support the first pin 61 and convert the movement of the load in the Y direction to a movement of the first pin 61 in the Z direction. The first pin 61 is moved downwards by the first elevating device 63 to be inserted into the first hole 401.

The second pin 62 is capable of being inserted into the second hole 402. The second elevating device 64 is configured to move the second pin 62 up and down. The second elevating device 64 is equipped with, by way of example, an air cylinder and a converting mechanism. The air cylinder moves a load along the Y direction. The converting mechanism is configured to support the second pin 62 and convert the movement of the load in the Y direction to a movement of the second pin 62 in the Z direction. The second pin 62 is moved downwards by the second elevating device 64 to be inserted into the second hole 402. As the first pin 61 is inserted into the first hole 401 and the second pin 62 is inserted into the second hold 402, the position of the tester 2t is fixed by the supporting device 50 and the fixing device 60.

In the exemplary embodiment, in each of the multiple testers 2t, the first hole 401 and the second hole 402 are spaced apart from each other at a preset distance. Further, the arrangement direction of the first hole 401 and the second hole 402 is inclined at a preset angle with respect to a transfer direction. The transfer direction is a direction in which each tester 2t is transferred between the corresponding inspection chamber and the alignment space, and is parallel to the Y direction That is, in this exemplary embodiment, each of the multiple testers 2t is provided with the first hole 401 and the second hole 402 such that the arrangement direction of the first hole 401 and the second hole 402 of the tester 2t is at the same angle with respect to the transfer direction and the first hole 401 and the second hole 402 are spaced apart from each other at the same distance. Therefore, according to the present exemplary embodiment, all the testers 2t can be fixed in the alignment space 4s in the same way by using the first pin 61 and the second pin 62.

In the present exemplary embodiment, the first hole 401 is a circular hole, as illustrated in FIG. 7A. The second hole 402 is an elongated hole, as illustrated in FIG. 7B. A long axis of the second hole 402 is extended on a straight line LH connecting a center of the first hole 401 and a center of the second hole 402.

In the exemplary embodiment, an opening end portion of the first hole 401 is formed and confined by a taper surface 401t, as shown in FIG. 8A. An opening end portion of the second hole 402 is formed and confined by a taper surface 402t, as shown in FIG. 8B. A leading end of the first pin 61 has a taper surface corresponding to the taper surface 401t. A leading end of the second pin 62 has a taper surface corresponding to the taper surface 402t. In the present exemplary embodiment, as the leading end of the first pin 61 comes into contact with the taper surface 401t and the leading end of the second pin 62 comes into contact with the taper surface 402t, the tester 2t is aligned with respect to the aligner 40 within the alignment space 4s. In the present exemplary embodiment, the tester 2t is sandwiched between the fixing device 60 (the first pin 61 and the second pin 62) and the supporting device 50 so that the position of the tester 2t is fixed.

Referring back to FIG. 1, the inspection system 1 further includes a control unit 15. The control unit 15 is provided within the placing table 10 in the present exemplary embodiment. The control unit 15 controls the individual components of the inspection system 1. The control unit 15 controls the loader 12r, the transfer device 14t, a driving unit of the shutter 16g, a driving unit of the shutter 18g, a driving unit of the shutter 14g, individual driving units of the shutters 2g, the driving unit of the moving device 41, the driving unit of the moving device 42, individual driving units of the stage 40x, the stage 40y and the stage 40z, the attracting unit 40s, the first driving unit 71m, the second driving unit 72m, the first elevating device 63, the second elevating device 64, the chiller unit 20u, and so forth. The control unit 15 is equipped with a processor, an input device such as a keyboard and a mouse, a display device, a storage device such as a memory, and a signal input/output interface. In the control unit 15, the processor is operated according to a control program stored in the storage device. Accordingly, control signals are outputted from the control unit 15. The individual components of the inspection system 1 are controlled by the outputted control signals.

Now, an operation of the inspection system 1 will be explained. The operation of the inspection system 1 to be described in the following can be implemented by the control of the control unit 15 over the individual components of the inspection system 1.

In the inspection system 1, one of the multiple testers 2t is transferred into the alignment space 4s from the corresponding one of the multiple inspection chambers 2c by the transfer device 70. The transferred tester 2t is placed on the aligner 40 within the alignment space 4s. The transfer device 70 adjusts the position of the tester 2t in the Y direction based on the detection signal from the sensor. Further, the chuck top 22 attracted to the tester 2t is also transferred into the alignment space 4s along with the tester 2t.

The, the aligner 40 is moved upwards by the moving device 42. Accordingly, the supporting device 50 (for example, the plurality of cam followers) supports the tester 2t from below. The moving device 42 is controlled based on the detection signals from the plurality of sensors 56. Accordingly, the tester 2t is supported horizontally on the supporting device 50.

Thereafter, the position of the tester 2t with respect to the aligner 40 within the alignment space 4s is fixed by using the fixing device 60 as well as the supporting device 50. For example, as the first pin 61 and the second pin 62 are inserted into the first hole 401 and the second hole 402, respectively, the position of the tester 2t with respect to the aligner 40 is fixed.

Afterwards, the stage 40z of the aligner 40 is moved up to allow the chuck top 22 to be mounted on the attracting unit 40s. Then, the attraction of the chuck top 22 by the tester 2t is released, and the chuck top 22 is attracted by the attracting unit 40s. For the alignment of the chuck top 22 on the attracting unit 40s, the position of the aligner 40 is adjusted based on the image acquired by the upper camera 40u.

Subsequently, a substrate W is transferred onto the chuck top 22 by the transfer device 14t. For the alignment of the substrate W on the chuck top 22, the position of the aligner 40 is adjusted based on the image acquired by the upper camera 40u. Then, the substrate W is attracted by the chuck top 22.

Next, the alignment of the substrate W with respect to the tester 2t is performed. To elaborate, the alignment of the substrate W with respect to the tester 2t is performed as the positions of the stage 40x and the stage 40y are adjusted based on the image acquired by the lower camera 40d.

Then, the stage 40z is moved up. As a result, the contact probes 26p come into contact with the electrodes of the electronic device of the substrate W. Thereafter, as the space surrounded by the bellows 30 is decompressed and the attraction of the chuck top 22 by the attracting unit 40s is released, the chuck top 22 is attracted to the tester 2t.

Subsequently, the tester 2t and the chuck top 22 are returned back into the corresponding inspection chamber 2c by the transfer device 70. Then, within the inspection chamber 2c, the electrical characteristic of the electronic device within the substrate W is inspected by the tester 2t. The above-described operations are performed on other substrates as well by using other testers 2t.

In the inspection system 1 as described above, the tester 2t transferred into the alignment space 4s from the corresponding inspection chamber 2c is supported from below by the supporting device 50 within the alignment space 4s. Then, the position of the tester 2t with respect to the aligner 40 is fixed within the alignment space 4s by the fixing device 60 and the supporting device 50. Accordingly, in this inspection system 1, the position of the tester 2t accommodated in the alignment space 4s with respect to the aligner 40 is not changed for each of the testers 2t. As a result, the alignment of the substrate W with respect to the tester 2t can be performed with high accuracy.

Figure 9:
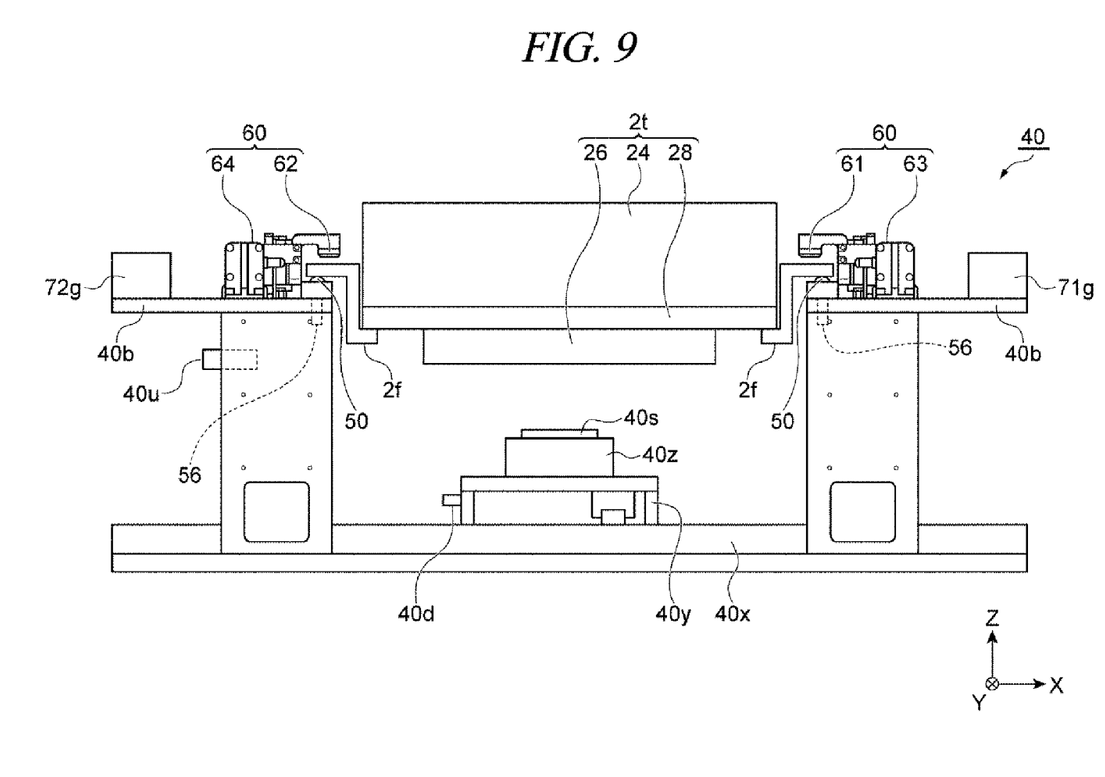
FIG. 9 is a side view of an aligner applicable to the inspection system shown in FIG. 1.

So far, the various exemplary embodiments have been described. However, the above-described exemplary embodiments are not limiting, and various changes and modifications may be made. By way of example, the supporting device 50 may have a plurality of ball transfer units instead of the cam followers. FIG. 9 is a side view of an aligner applicable to the inspection system shown in FIG. 1. As depicted in FIG. 9, some of the ball transfer units of the supporting device 50 are arranged on one of the pair of bridges 40b in the Y direction and configured to directly support one of the pair of upper end portions of the frame 2f from below. The others of the ball transfer units are arranged on the other of the pair of bridges 40b in the Y direction and configured to directly support the other of the pair of upper end portions of the frame 2f from below. Each of the ball transfer units is configured to support an object on a spherical body configured to be rotatable in any direction. Thus, in this example, the tester 2t is slidable on the supporting device 50 in a direction perpendicular to the Z direction.

Figure 10:
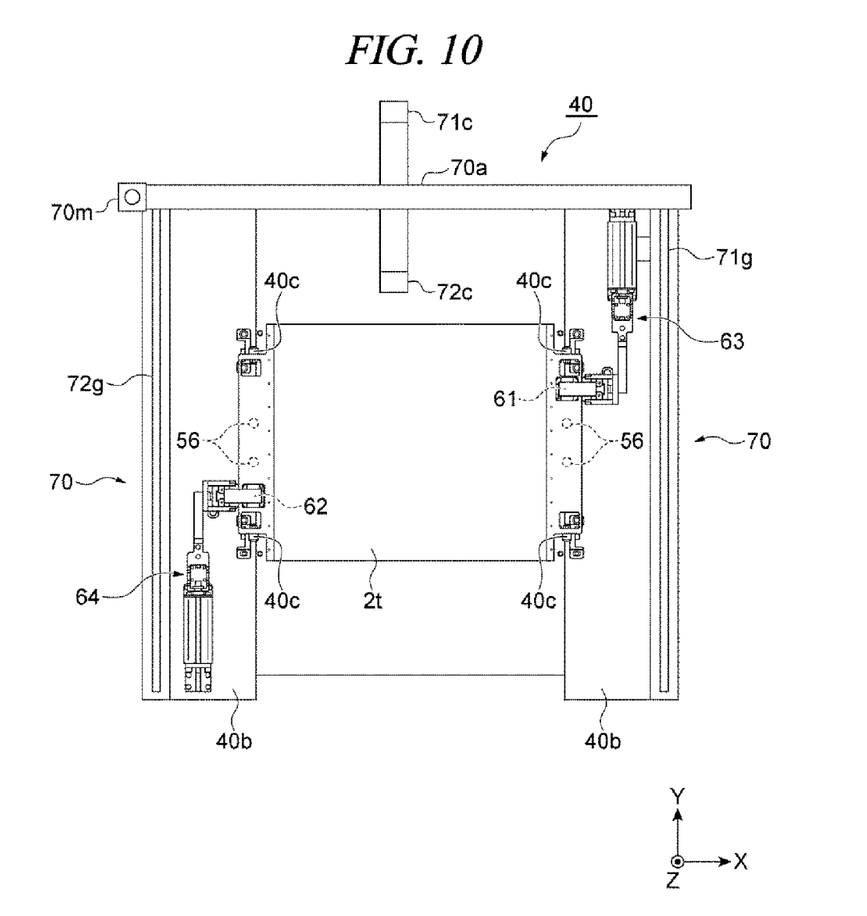
FIG. 10 is a top view of an aligner applicable to the inspection system shown in FIG. 1.

FIG. 10 is a top view of an aligner applicable to the inspection system shown in FIG. 1. As depicted in FIG. 10, the transfer device 70 may have a single arm 70a instead of the first arm 71a and the second arm 72a and a single driving unit 70m instead of the first driving unit 71m and the second driving unit 72m. The arm 70a is extended in the X direction and is movable in the Y direction and the opposite direction along the first guide 71g and the second guide 72g. The driving unit 70m is configured to rotate the screw shaft of the first guide 71g. The driving unit 70m is, by way of non-limiting example, a motor. If the screw shaft of the first guide 71g is rotated, the arm 70a is moved in the Y direction and the opposite direction. The arm 70a supports both the first clamp 71c and the second clamp 72c. The first clamp 71c is extended from the arm 70a (for example, from a center of the arm 70a in the X direction) in the Y direction. The second clamp 72c is extended from the arm 70a (for example, from the center of the arm 70a in the X direction) in the opposite direction to the Y direction. In this example, it is possible to move the two clamps by using the single moving device.

Further, in the above-described exemplary embodiment, though the two holes, that is, the first hole 401 and the second hole 402 are provided at each of the multiple testers 2t and the two pins, that is, the first pin 61 and the second pin 62 are provided at the fixing device 60, the number of the holes provided at the testers 2t and the number of the pins provided at the fixing device 60 are not limited thereto. The number of the holes provided at the testers 2t and the number of the pins provided at the fixing device 60 may be, by way of example, but not limitation, four or six.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. An inspection system, comprising:
an inspection module having multiple testers each of which is equipped with a probe card and a test head and having multiple inspection chambers configured to respectively accommodate therein the multiple testers;
an alignment module having an aligner placed in an alignment space allowed to be connected to the multiple inspection chambers, the aligner being configured to adjust a position of a substrate to be inspected with respect to one tester of the multiple testers, which is accommodated in the alignment space;
a supporting device configured to support the tester accommodated in the alignment space from below;
a fixing device configured to position-align the tester accommodated in the alignment space with respect to the aligner and fix the tester in cooperation with the supporting device; and
a transfer device configured to transfer each of the multiple testers into the alignment space from the corresponding one of the multiple inspection chambers and place the transferred tester on the aligner within the alignment space,
wherein the multiple inspection chambers are provided at both sides of the alignment space, and
the transfer device comprises:
a first clamp configured to grip one of the multiple testers, which is arranged at one side of the alignment space;
a second clamp configured to grip one of the multiple testers, which is arranged at the other side of the alignment space;
a first moving device configured to move the first clamp from the alignment space in a direction toward the one side of the alignment space and in an opposite direction thereto; and
a second moving device configured to move the second clamp from the alignment space in a direction toward the other side of the alignment space and in an opposite direction thereto.

2. The inspection system of claim 1,
wherein each of the multiple testers is provided with a first hole and a second hole opened upwards, and
the fixing device comprises:
a first pin and a second pin allowed to be respectively inserted into the first hole and the second hole to position-align the tester accommodated in the alignment space with respect to the aligner; and
an elevating device configured to move the first pin and the second pin up and down.

3. The inspection system of claim 2,
wherein the first hole and the second hole are spaced apart from each other at a preset distance, and
a direction in which the first hole and the second hole are arranged is inclined at a preset angle with respect to a transfer direction in which each of the multiple testers is transferred between the alignment space and the corresponding one of the multiple inspection chambers.

4. The inspection system of claim 3,
wherein the first hole is a circular hole, and the second hole is an elongated hole, and
a long axis of the second hole is extended on a straight line connecting a center of the first hole and a center of the second hole.

5. The inspection system of claim 4,
wherein an opening end portion of each of the first hole and the second hole is formed by a taper surface, and
the tester accommodated in the alignment space is position-aligned with respect to the aligner as the first pin comes into contact with the taper surface forming the first hole and the second pin comes into contact with the taper surface forming the second hole.

6. The inspection system of claim 1,
wherein the supporting device is configured to support the tester such that the tester accommodated in the alignment space is allowed to be slid on the supporting device.

7. The inspection system of claim 6,
wherein the supporting device includes multiple cam followers or multiple ball transfer units.

8. The inspection system of claim 1, further comprising:
a sensor configured to detect whether the tester accommodated in the alignment space is supported horizontally by the supporting device.

9. An inspection system, comprising:
an inspection module having multiple testers each of which is equipped with a probe card and a test head and having multiple inspection chambers configured to respectively accommodate therein the multiple testers;
an alignment module having an aligner placed in an alignment space allowed to be connected to the multiple inspection chambers, the aligner being configured to adjust a position of a substrate to be inspected with respect to one tester of the multiple testers, which is accommodated in the alignment space;
a supporting device configured to support the tester accommodated in the alignment space from below;
a fixing device configured to position-align the tester accommodated in the alignment space with respect to the aligner and fix the tester in cooperation with the supporting device; and
a transfer device configured to transfer each of the multiple testers into the alignment space from the corresponding one of the multiple inspection chambers and place the transferred tester on the aligner within the alignment space,
wherein the multiple inspection chambers are arranged at both sides of the alignment space, and
the transfer device comprises:
a first clamp configured to grip one of the multiple testers, which is arranged at one side of the alignment space;
a second clamp configured to grip one of the multiple testers, which is arranged at the other side of the alignment space; and
a moving device configured to move both the first clamp and the second clamp in a direction from the one side of the alignment space toward the other side thereof and in an opposite direction thereto.

10. The inspection system of claim 9,
wherein each of the multiple testers is provided with a first hole and a second hole opened upwards, and the fixing device comprises:
a first pin and a second pin allowed to be respectively inserted into the first hole and the second hole to position-align the tester accommodated in the alignment space with respect to the aligner; and
an elevating device configured to move the first pin and the second pin up and down.

11. The inspection system of claim 10,
wherein the first hole and the second hole are spaced apart from each other at a preset distance, and
a direction in which the first hole and the second hole are arranged is inclined at a preset angle with respect to a transfer direction in which each of the multiple testers is transferred between the alignment space and the corresponding one of the multiple inspection chambers.

12. The inspection system of claim 11,
wherein the first hole is a circular hole, and the second hole is an elongated hole, and
a long axis of the second hole is extended on a straight line connecting a center of the first hole and a center of the second hole.

13. The inspection system of claim 12,
wherein an opening end portion of each of the first hole and the second hole is formed by a taper surface, and
the tester accommodated in the alignment space is position-aligned with respect to the aligner as the first pin comes into contact with the taper surface forming the first hole and the second pin comes into contact with the taper surface forming the second hole.

14. The inspection system of claim 9,
wherein the supporting device is configured to support the tester such that the tester accommodated in the alignment space is allowed to be slid on the supporting device.

15. The inspection system of claim 14,
wherein the supporting device includes multiple cam followers or multiple ball transfer units.

16. The inspection system of claim 9, further comprising:
a sensor configured to detect whether the tester accommodated in the alignment space is supported horizontally by the supporting device.

* * * * *